(12) United States Patent
Gorbachov et al.

(10) Patent No.: US 10,608,590 B2
(45) Date of Patent: *Mar. 31, 2020

(54) HIGH-GAIN LOW NOISE FIGURE LOW NOISE COMPLEMENTARY METAL OXIDE SEMICONDUCTOR AMPLIFIER WITH LOW CURRENT CONSUMPTION

(71) Applicant: Skyworks Solutions, Inc., Woburn, MA (US)

(72) Inventors: Oleksandr Gorbachov, Irvine, CA (US); Lisette L. Zhang, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/370,311

(22) Filed: Mar. 29, 2019

(65) Prior Publication Data

US 2019/0229679 A1    Jul. 25, 2019

Related U.S. Application Data

(63) Continuation of application No. 15/652,906, filed on Jul. 18, 2017, now Pat. No. 10,250,191, and a (Continued)

(51) Int. Cl.
*H04B 1/16* (2006.01)
*H03F 1/02* (2006.01)
(Continued)

(52) U.S. Cl.
CPC .......... *H03F 1/0205* (2013.01); *H03F 1/223* (2013.01); *H03F 1/347* (2013.01); *H03F 1/565* (2013.01); *H03F 3/193* (2013.01); *H03F 3/195* (2013.01); *H03F 3/245* (2013.01); *H04B 1/48* (2013.01); *H03F 2200/222* (2013.01);
(Continued)

(58) Field of Classification Search
CPC ........ H03F 1/0205; H03F 3/195; H03F 3/245; H04B 1/48
See application file for complete search history.

(56) References Cited

U.S. PATENT DOCUMENTS 9,735,737 B2 *   8/2017   Gorbachov ........... H03F 1/0205
10,250,191 B2 *  4/2019   Gorbachov ........... H03F 1/0205
(Continued)

*Primary Examiner* — Tuan Pham
(74) *Attorney, Agent, or Firm* — Stetina Brunda Garred & Brucker

(57) ABSTRACT

A radio frequency low noise amplifier circuit with a receive signal input, a receive signal output, and a voltage source include a low noise amplifier and a coupled inductor circuit with a primary inductive chain connected to the output of the low noise amplifier and to the voltage source. The coupled inductor circuit further includes a secondary inductive chain with a first inductor electromagnetically coupled to the primary inductive chain, and a second inductor in series with the first inductor and magnetically coupled to the primary inductive chain. The second inductor is connected to a feedback node of the low noise amplifier. There is an output matching network connected to the first inductor of the secondary inductive chain and to the receive signal output.

30 Claims, 10 Drawing Sheets

Related U.S. Application Data continuation of application No. 15/352,101, filed on Nov. 15, 2016, now Pat. No. 9,735,737.

(60) Provisional application No. 62/264,750, filed on Dec. 8, 2015.

(51) Int. Cl.

| | | |
|---|---|---|
| *H03F 1/22* | (2006.01) | |
| *H03F 1/34* | (2006.01) | |
| *H03F 3/193* | (2006.01) | |
| *H03F 1/56* | (2006.01) | |
| *H03F 3/195* | (2006.01) | |
| *H03F 3/24* | (2006.01) | |
| *H04B 1/48* | (2006.01) | |

(52) U.S. Cl.
CPC .. *H03F 2200/294* (2013.01); *H03F 2200/387* (2013.01); *H03F 2200/451* (2013.01); *H03F 2200/489* (2013.01)

(56) References Cited

U.S. PATENT DOCUMENTS

| | | | | |
|---|---|---|---|---|
| 2013/0281041 | A1* | 10/2013 | Choksi | H04B 1/12 455/298 |
| 2014/0347142 | A1* | 11/2014 | Chang | H03H 7/0184 333/25 |
| 2015/0035600 | A1* | 2/2015 | Jin | H03F 1/565 330/277 |

* cited by examiner

HIGH-GAIN LOW NOISE FIGURE LOW NOISE COMPLEMENTARY METAL OXIDE SEMICONDUCTOR AMPLIFIER WITH LOW CURRENT CONSUMPTION

CROSS-REFERENCE TO RELATED APPLICATIONS

This application is a continuation of U.S. patent application Ser. No. 15/652,906 filed Jul. 18, 2017 and entitled "HIGH-GAIN LOW NOISE FIGURE COMPLEMENTARY METAL OXIDE SEMICONDUCTOR AMPLIFIER WITH LOW CURRENT CONSUMPTION," which is a continuation patent application of U.S. patent application Ser. No. 15/352,101 filed Nov. 15, 2016 and issued as U.S. Pat. No. 9,735,737 on Aug. 15, 2017 and entitled "HIGH-GAIN LOW NOISE FIGURE COMPLEMENTARY METAL OXIDE SEMICONDUCTOR AMPLIFIER WITH LOW CURRENT CONSUMPTION," which relates to and claims the benefit under 35 U.S.C. § 119(e) to U.S. Provisional Patent Application No. 62/264,750 filed Dec. 8, 2015 and entitled "HIGH-GAIN LOW NOISE FIGURE CMOS LNA WITH LOW CURRENT CONSUMPTION," the entire contents of each of which is wholly incorporated by reference herein.

STATEMENT RE: FEDERALLY SPONSORED RESEARCH/DEVELOPMENT

Not Applicable

BACKGROUND

1. Technical Field

The present disclosure relates generally to radio frequency integrated circuits, and more particularly, those fabricated with complementary metal oxide semiconductor (CMOS) technology. The present disclosure also relates to a high gain, low noise figure low noise amplifiers with low current consumption.

2. Related Art

Wireless communications systems are utilized in a variety contexts involving information transfer over long and short distances alike, and a wide range of modalities for addressing the particular needs of each being known in the art. As a general matter, wireless communications involve a radio frequency carrier signal that is variously modulated to represent information/data, and the encoding, modulation, transmission, reception, de-modulation, and decoding of the signal conform to a set of standards for coordination of the same.

Many different mobile communication technologies or air interfaces exist, including GSM (Global System for Mobile Communications), EDGE (Enhanced Data rates for GSM Evolution), and UMTS (Universal Mobile Telecommunications System) W-CDMA (Wideband Code Division Multiple Access). More recently, 4G (fourth generation) technologies such as LTE (Long Term Evolution), which is based on the earlier GSM and UMTS standards, are being deployed.

Besides these mobile communications modalities, there are local area wireless data networking modalities such as Wireless LAN (WLAN)/Wi-Fi, WiMax, and so forth. Several computer systems or network nodes within a local area can connect to an access point, which in turn may provide a link to other networks and the greater global Internet network. Computing devices of all form factors, from mobile phones, tablets, and personal computers now have Wi-Fi connectivity, and Wi-Fi networks may be found everywhere.

A fundamental component of any wireless communications system is the transceiver, that is, the combined transmitter and receiver circuitry. The transceiver encodes the data to a baseband signal and modulates it with a radio frequency carrier signal. Upon receipt, the transceiver down-converts the radio frequency signal, demodulates the baseband signal, and decodes the data represented by the baseband signal. An antenna connected to the transmitter converts the electrical signals to electromagnetic waves, and an antenna connected to the receiver converts the electromagnetic waves back to electrical signals.

The output of the transmitter is connected to a power amplifier, which amplifies the outgoing radio frequency signals prior to transmission via the antenna. The receiver is connected to the output of a low noise amplifier, the input of which is connected to the antenna and receives incoming radio frequency signals. Depending on the particulars of the communications modality, single or multiple antennas may be utilized. A transmit/receive switch selectively interconnects the antenna(s) to the output of the power amplifier during transmission, and to the input of the low noise amplifier during reception. Additionally, there may be a power detector circuit to measure the output power to control variable gain blocks in the transceiver chain. Thus, the power amplifier, the low noise amplifier, the antenna switch(es), and the power detector serve as key building blocks in radio frequency transceiver circuitry.

In order to lower manufacturing costs and allow full integration of a complete radio frequency System-on-Chip (SoC) capable of multimode and multiband operation, complementary metal oxide semiconductor (CMOS) technology is utilized. The low noise amplifier, the antenna switches, and the transceiver radio frequency circuit are thus being implemented on a single integrated circuit die. Such silicon-based single chip systems are dominant in GSM, WLAN, Bluetooth, WCDMA, and LTE applications. Furthermore, advancements in nanometer-level semiconductor fabrication, together with increasing device unity power gain frequency ($f_{max}$), CMOS technologies have become a viable low-cost option for highly integrated radio frequency products utilized in the most popular applications.

A challenge with radio frequency system-on-chip implementations is the requirement of extremely low noise figures, low current consumption, and low insertion loss with respect to the low noise amplifier. Most conventional mobile devices employ a standalone low noise amplifier with a single pole, multiple throw (SPnT) switch fabricated with Silicon Germanium (SiGe) heterojunction bipolar transistors (HBT), or Silicon on Insulator (SoI) process. The low noise amplifier is thus not integrated with the power amplifier front end integrated circuit as a complete front end module.

One conventional low noise amplifier design is a single transistor, common source complementary metal-oxide semiconductor circuit, with a tank circuit that is cascoded or connected to the drain of the transistor. Because of the lower transconductance levels of typical CMOS transistors, including n-channel metal oxide semiconductor field effect transistors, increased sizes and higher supplier currents are needed to reach similar gain and noise figure levels relative to bipolar transistor-based amplifier circuits. With a low noise amplifier fabricated with a standard 0.18 µm bulk-CMOS process, biased at 1.8V and having a DC current consumption of 10 mA, a low noise figure of approximately 0.65 dB may be possible, but gain is low, e.g., approximately 9 to 10.9 dB, at the 5 GHz operating frequency.

The latest mobile communication devices require low current consumption together with increase gain in relation to the low noise amplifier to recover losses associated with filters, diplexers, and printed circuit board traces between the antenna(s) and the RF receiver. When current consumption is reduced, however, it is understood that reductions in gain and increases in noise figure will result.

A cascode transistor may be used to improve the gain and input/output isolation, but this is understood to increase noise and require higher bias voltages. In a known cascode transistor low noise amplifier circuit, a bias of 3.3V with a DC current consumption of 10 mA, noise figures may be increased by 0.2 dB to 0.3 dB, with similar gain at the 5 GHz operating frequency as in the aforementioned single transistor circuit.

Accordingly, there is a need in the art for a low noise amplifier circuit with improved noise figure and increased gain. There is also a need in the art for such low noise amplifier circuits to have reduced current consumption.

BRIEF SUMMARY

The present disclosure contemplates various embodiments of a radio frequency low noise amplifier that may be fabricated with a bulk complementary metal oxide semiconductor (CMOS) process for front end circuits in cellular, Wi-Fi, and Internet of Things (IoT) applications. The low noise amplifier may have a noise figure of under 1 dB in the 5 GHz operating frequency band, and have a current consumption of approximately 10 mA with a 1.8V bias voltage.

According to one embodiment, there is a radio frequency low noise amplifier circuit with a receive signal input and a receive signal output to which a load is connected. The circuit may include a low noise amplifier with an input, an output, and a feedback node. The input may be connected to the receive signal input. The circuit may also include a coupled inductor circuit with a primary inductor electromagnetically coupled to a first secondary inductor that is in turn connected to the feedback node of the low noise amplifier. A transformation factor of radio frequency current through the primary inductor and the load connected to the receive signal output may be increased as a result. The primary inductor may be connected to the low noise amplifier. The circuit may further include an output matching network that is connected to the first secondary inductor of the coupled inductor circuit and to the receive signal output.

According to another embodiment of the present disclosure, there is disclosed a radio frequency low noise amplifier circuit with a receive signal input, a receive signal output, and a voltage source. The circuit may include a low noise amplifier with an input, an output, and a feedback node, and the input may be connected to the receive signal input. There may also be a primary inductive chain that is connected to the output of the low noise amplifier and to the voltage source. Further, there may be a secondary inductive chain including a first inductor electromagnetically coupled to the primary inductive chain, and a second inductor in series with the first inductor and magnetically coupled to the primary inductive chain. The second inductor may be connected to the feedback node of the low noise amplifier. The circuit may include an output matching network connected to the first inductor of the secondary inductive chain and to the receive signal output.

Still another embodiment of the present disclosure contemplates a radio frequency communications module. There may be a packaging substrate on which a plurality of components are mounted. Additionally, there may be a radio frequency low noise amplifier implemented on the packaging substrate. The radio frequency low noise amplifier circuit may include a low noise amplifier with an input, an output, and a feedback node, and a coupled inductor circuit including a primary inductor electromagnetically coupled to a first secondary inductor connected to the feedback node of the low noise amplifier with a transformation factor of radio frequency current through the primary inductor and the load connected to the receive signal output being increased. The primary inductor may be connected to the low noise amplifier.

Another embodiment is a wireless communications device that includes an antenna receptive to an incoming radio frequency signal and transmissive of an outgoing radio frequency signal. The device may include a radio frequency amplifier connected to the antenna. The radio frequency amplifier circuit may include a low noise amplifier with an input, an output, and a feedback node. The radio frequency amplifier circuit may also include a coupled inductor circuit with a primary inductor electromagnetically coupled to a first secondary inductor connected to the feedback node of the low noise amplifier. A transformation factor of radio frequency current through the primary inductor and the load connected to the receive signal output may be increased. The primary inductor may be connected to the low noise amplifier.

The present invention will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The detailed description set forth below in connection with the appended drawings is intended as a description of the several presently contemplated embodiments of high gain, low noise figure low noise amplifier circuits with low current consumption, and are not intended to represent the only form in which the disclosed circuits may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
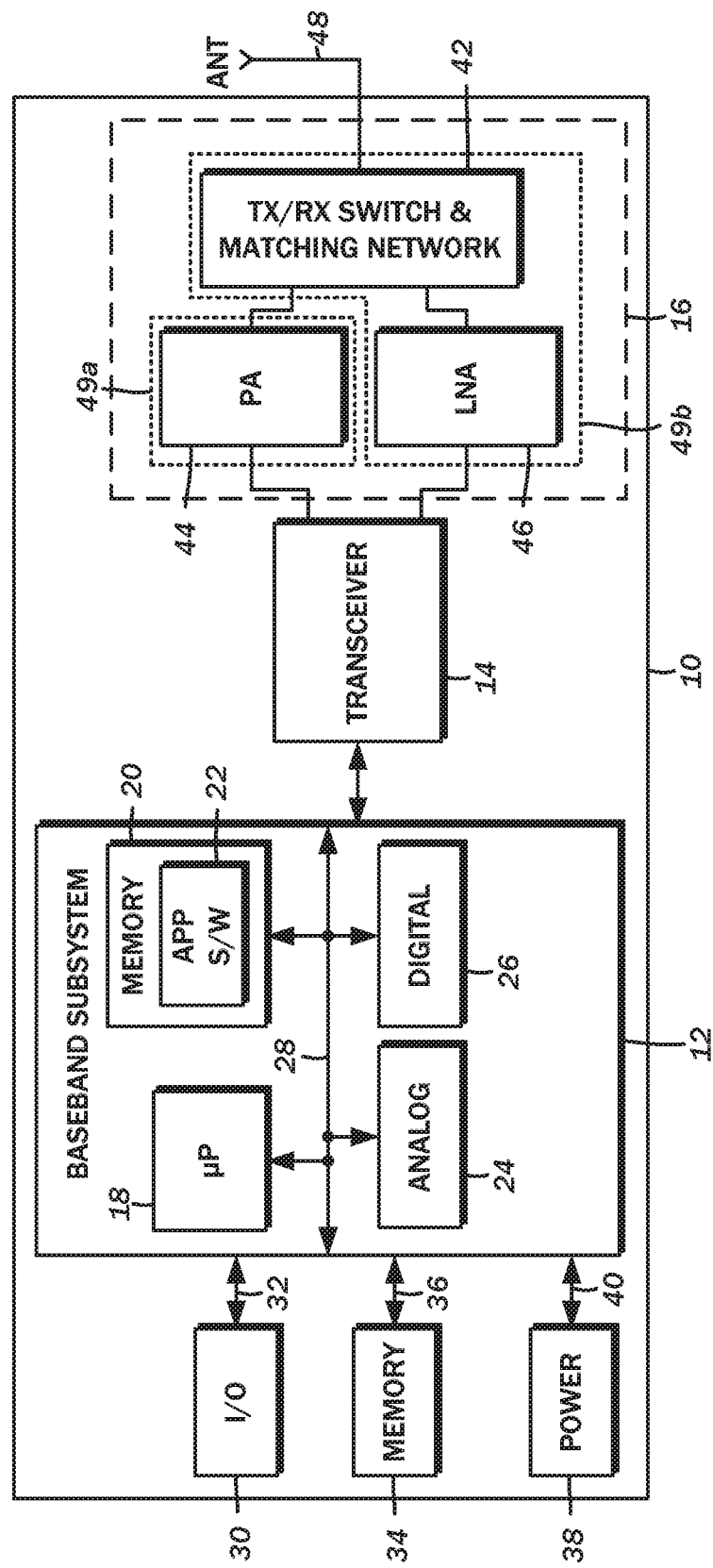
FIG. 1 is a block diagram of an exemplary wireless communications device that may incorporate a low noise amplifier circuit in accordance with the present disclosure.

FIG. 1 illustrates a simplified wireless communications device 10 in which various embodiments of the low noise amplifier circuit in accordance with the present disclosure may be incorporated. In various embodiments, the wireless communications device 10 can be a cellular telephone. However, the low noise amplifier circuit may be utilized in any wireless device with signal reception capabilities. The wireless communications device 10 illustrated in FIG. 1 is intended to be a simplified example of a cellular telephone and to illustrate one of many possible applications in which the low noise amplifier circuit can be implemented. One having ordinary skill in the art will understand the operation of a cellular telephone, and, as such, implementation details are omitted.

The wireless communications device 10 includes a baseband subsystem 12, a transceiver 14, and a front end module 16. Although omitted from FIG. 1, the transceiver 14 includes modulation and upconversion circuitry for preparing a baseband information signal for amplification and transmission, and includes filtering and downconversion circuitry for receiving and downconverting a radio frequency signal to a baseband information signal to recover data. The details of the operation of the transceiver 14 are known to those skilled in the art.

The baseband subsystem 12 generally includes a processor 18, which can be a general purpose or special purpose microprocessor, memory 20, application software 22, analog circuit elements 24, and digital circuit elements 26, connected over a system bus 28. The system bus 28 can include the physical and logical connections to couple the above-described elements together and enable their interoperability.

An input/output (I/O) element 30 is connected to the baseband subsystem 12 over a connection 32, a memory element 34 is coupled to the baseband subsystem 12 over a connection 36 and a power source 38 is connected to the baseband subsystem 12 over connection 40. The I/O element 30 can include, for example, a microphone, a keypad, a speaker, a pointing device, user interface control elements, and any other device or system that allows a user to provide input commands and receive outputs from the wireless communications device 10.

The memory 20 can be any type of volatile or non-volatile memory, and in an embodiment, can include flash memory. The memory element 34 can be permanently installed in the wireless communications device 10, or can be a removable memory element, such as a removable memory card.

The power source 38 can be, for example, a battery, or other rechargeable power source, or can be an adaptor that converts AC power to the correct voltage used by the wireless communications device 10. In an embodiment, the power source can be a battery that provides a nominal voltage output of approximately 3.6 volts (V). However, the output voltage range of the power source can range from approximately 3.0 to 6.0 V.

The processor 18 can be any processor that executes the application software 22 to control the operation and functionality of the wireless communications device 10. The memory 20 can be volatile or non-volatile memory, and in an embodiment, can be non-volatile memory that stores the application software 22.

The analog circuit elements 24 and the digital circuit elements 26 include the signal processing, signal conversion, and logic that convert an input signal provided by the I/O element 30 to an information signal that is to be transmitted. Similarly, the analog circuit elements 24 and the digital circuit elements 26 include the signal processing, signal conversion, and logic that convert a received signal provided by the transceiver 14 to an information signal that contains recovered information. The digital circuit elements 26 can include, for example, a Digital Signal Processor (DSP), a Field Programmable Gate Array (FPGA), or any other processing device. Because the baseband subsystem 12 includes both analog and digital elements, it is sometimes referred to as a mixed signal circuit.

The front end module 16 is generally comprised of components belonging to a transmit signal chain, components belonging to a receive signal chain, and a switch 42. For purposes of simplification, the transmit signal chain is generally represented by a power amplifier circuit 44, while the receive signal chain is generally represented by a low noise amplifier circuit 46. The switch 42 interconnects the power amplifier circuit 44 and the low noise amplifier circuit 46 to an antenna 48. The front end module 16 depicted in FIG. 1 is understood to be for a single wireless operating mode, and those having ordinary skill in the art will appreciate that a conventional wireless communications device 10 has multiple wireless operating modes conforming to different standards. Accordingly, there may be multiple front end modules 16 particularly configured for each operating mode, or one front end module 16 with multiple constituent components for each operating mode. Along these lines, these different operating modes may utilize more than one antenna at a time (diversity mode operation), so the single antenna 48 is presented by way of example only and not of limitation.

In some embodiments, because of the differing and oftentimes conflicting performance requirements, the power amplifier circuit 44 may be fabricated on one die 49a with one semiconductor fabrication technology, while the low noise amplifier circuit 46 may be fabricated on another die 49b. The switch 42 may also be implemented on the same die 49b as the low noise amplifier circuit 46 in some embodiments.

Figure 2:
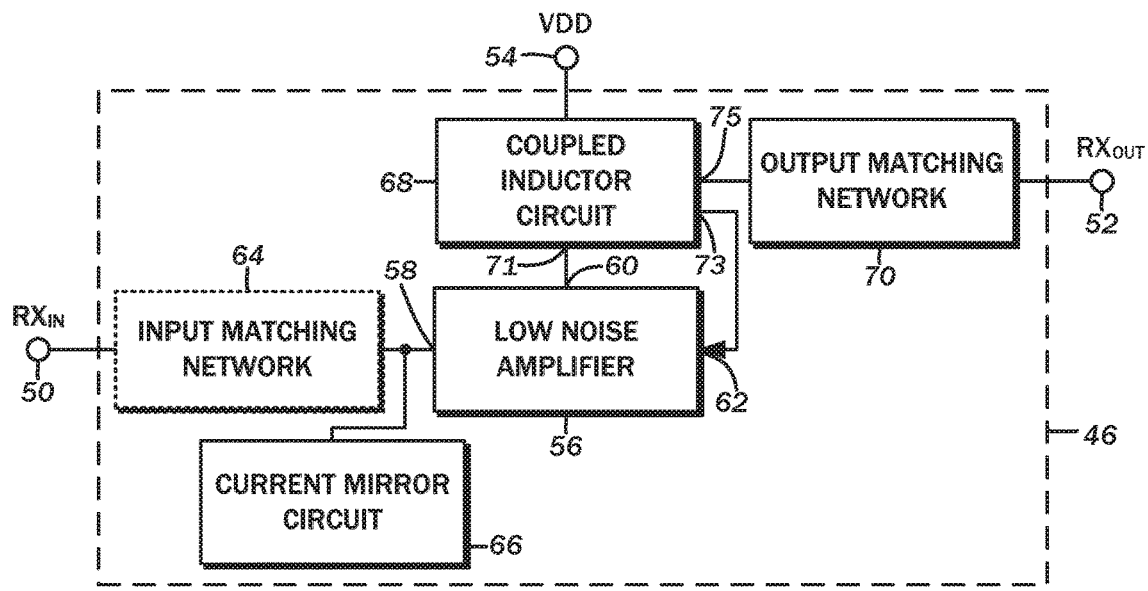
FIG. 2 is a block diagram of the high gain, low noise figure complementary metal oxide semiconductor low noise amplifier circuit with low current consumption.

The block diagram of FIG. 2 depicts additional details of an embodiment of the low noise amplifier circuit 46. There is a receive signal input $Rx_{in}$ 50, which may be indirectly connected to the antenna 48 to receive incoming radio frequency signals. As discussed above, the switch 42 may selectively interconnect the antenna 48 to either the power amplifier circuit 44 or the low noise amplifier circuit 46, and so the receive signal input 50 may be connected to an appropriate terminal of the switch 42. Additionally, the low noise amplifier circuit 46 has a receive signal output $Rx_{out}$ 52 that passes the amplified incoming radio frequency signal to a load, which is typically the transceiver 14. In order to power the low noise amplifier circuit 46 and its active components, there is a connection to a supply voltage VDD 54.

The low noise amplifier circuit 46 includes a low noise amplifier 56 with an input 58 and an output 60, as well as a feedback node 62. The input 58 is connected to the receive signal input 50, though there is an input matching network 64 that impedance and noise matches the input 58 of the low noise amplifier 56 to the switch 42 and the antenna 48 that are connected thereto. The low noise amplifier circuit 46 further incorporates a current mirror circuit 66 that is also connected to the low noise amplifier 56, specifically, at the input 58 thereof. Those having ordinary skill in the art will recognize that the current mirror circuit 66 is utilized for setting the bias point of the low noise amplifier 56, and facilitates the quiescent state of the active components of the same. Furthermore, the current mirror circuit 66 is understood to stabilize the current draw of the low noise amplifier 56 to which it is connected, and with which it cooperates. The output 60 of the low noise amplifier 56 is connected to a coupled inductor circuit 68 via its input 71. The coupled inductor circuit 68 is understood to increase the gain of the low noise amplifier 56 without additional noise. The coupled inductor circuit 68, via its feedback node 73, is also connected to the aforementioned feedback node 62, with the detailed functionality of this feature being described more fully below. An output 75 of the coupled inductor circuit 68 is connected to an output matching network 70, which impedance matches the low noise amplifier 56 to the load connected to the receive signal output 52, e.g., the transceiver 14.

Figure 3:
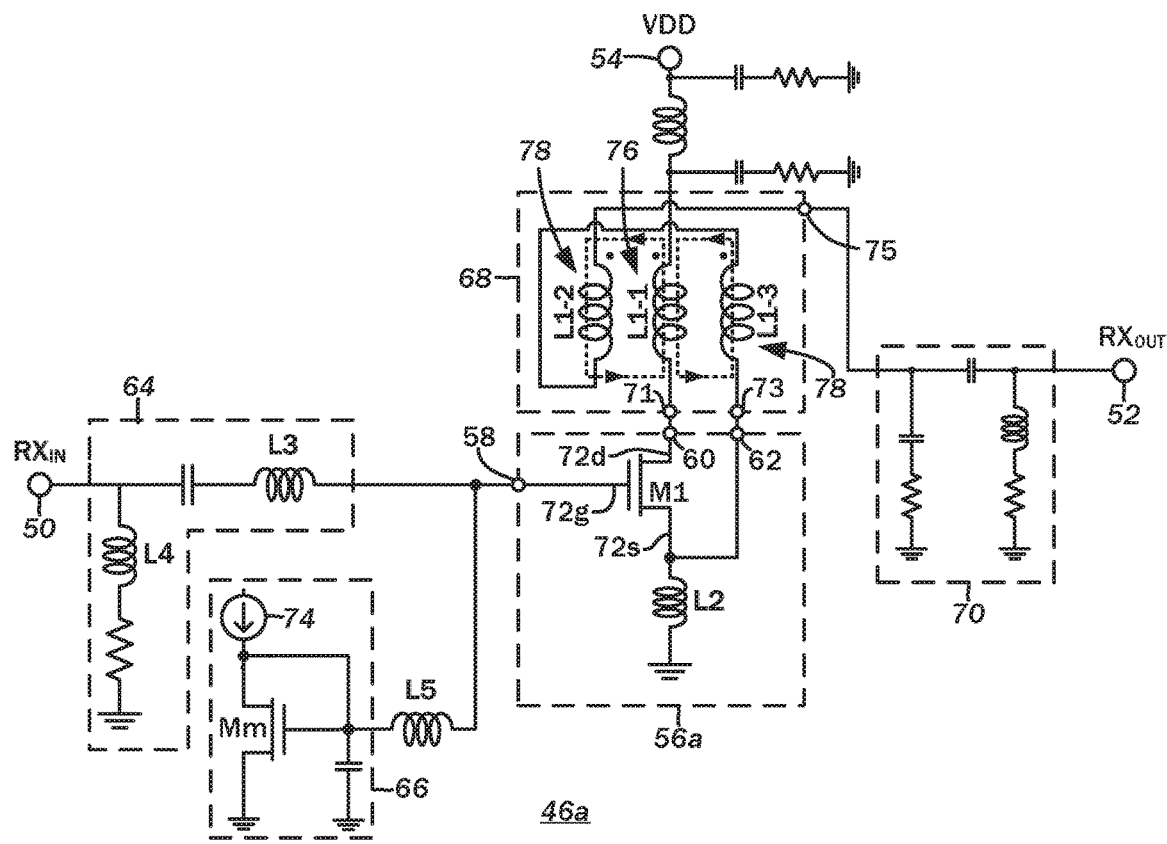
FIG. 3 is a schematic diagram of a first implementation of the low noise amplifier circuit according to the present disclosure.

Referring now to the schematic diagram of FIG. 3, additional details of a first embodiment of the low noise amplifier circuit 46a will be considered. The circuit includes a first embodiment of the low noise amplifier 56a, which utilizes a single transistor M1 with a gate 72g, a source 72s, and a drain 72d. The transistor M1, as shown, is in a common source configuration, with the source 72s being connected to ground/common via an inductor L2. The gate 72g is connected to the aforementioned input matching network 64, which in one embodiment is generally comprised of an inductor L3 and an inductor L4. The input matching network 64, in turn, is connected to the receive signal input 50. The inductor L2, together with the inductors L3 and L4 of the input matching network 64, may be tuned for impedance and noise matching at the input 58 of the low noise amplifier 56.

Also connected to the gate 72g is the current mirror circuit 66 comprised of a mirror transistor Mm connected to a current source 74. The current mirror circuit 66 is connected to the gate 72g of the low noise amplifier transistor M1 with an inductor L5, which is understood to be used for RF decoupling the current mirror circuit from the low noise amplifier 56.

In the illustrated embodiment, the low noise amplifier transistor M1 and the mirror transistor Mm are each an n-channel metal oxide semiconductor type transistor, though any other suitable transistor type may be readily substituted without departing from the scope of the present disclosure. Although the present disclosure makes reference to certain features that are specific to field effect transistors such as the gate, the source, and the drain, to the extent different types of transistors are substituted, those features are understood to have corollary features for such alternative transistor types, Furthermore, the transistors and the related circuitry may be fabricated using silicon-based technologies such as bulk CMOS (complementary metal oxide semiconductor), SOI (silicon-on-insulator), and BiCMOS (integration of bipolar junction and complementary metal oxide semiconductor fabrication technologies). Other semiconductor technologies such as GaAs (gallium arsenide) may also be utilized.

Various embodiments of the present disclosure contemplate the coupled inductor circuit 68, which is connected to the low noise amplifier 56. The coupled inductor circuit 68 includes a primary inductive chain 76, which in the illustrated embodiment is a primary inductor L1-1 that is connected to the drain 72d of the low noise amplifier transistor M1. As such, one node of the primary inductor L1-1 is understood to correspond to the input 71 of the coupled inductor circuit 68. The primary inductor L1-1 is also connected to the supply voltage VDD 54.

The coupled inductor circuit 68 also includes a secondary inductive chain 78, which may be comprised of a first secondary inductor L1-2 and a second secondary inductor L1-3. The first secondary inductor L1-2 is connected to the output matching network 70. Accordingly, one of the terminals of the first secondary inductor L1-2 corresponds to the output 75 of the coupled inductor circuit 68. As will be recognized by those having ordinary skill in the art, the output matching network 70 may be comprised of various inductive, capacitive, and resistive elements, and any configuration may be readily substituted without departing from the scope of the present disclosure.

The first secondary inductor L1-2 is also connected in series with the second secondary inductor L1-3, which is then connected to the feedback node 62 of the low noise amplifier 56, and specifically the source 72s of the low noise amplifier transistor M1. One node of the second secondary inductor L1-3 thus corresponds to the feedback node 73 of the coupled inductor circuit 68.

The primary inductive chain 76 is magnetically coupled to the secondary inductive chain 78 in accordance with various embodiments of the present disclosure. That is, the first secondary inductor L1-2 is independently electromagnetically coupled to the primary inductor L1-1, and the second secondary inductor L1-3 is also independently electromagnetically coupled to the primary inductor L1-1. This inductive coupling is understood to increase the transformation factor of the radio frequency current flowing through the drain 72d of the low noise amplifier transistor M1 to the load connected to the receive signal output 52. With the primary inductor L1-1 having a relatively small value, the impedance seen from the drain 72d of the low noise amplifier transistor M1 is understood to be high, which may consequentially result in a higher gain of the low noise amplifier 56. Furthermore, a portion of the radio frequency signal at the drain 72d of the low noise amplifier transistor M1 is fed back in-phase to the source 72s of the same, which is understood to further increase gain of the low noise amplifier 56. According to the foregoing circuit configuration of the low noise amplifier 56 and the coupled inductor circuit 68, the same amount of current is used in the common source inductor degenerated low noise amplifier for the amplified signal as the input signal. These effective boosts in gain of the low noise amplifier 56 do not require an added active device, so the overall noise figure thereof remains low. Because there is only a single active device, lower bias voltages may be utilized.

In accordance with various embodiments, the inductors of the low noise amplifier circuit 46, including the aforementioned primary inductor L1-1, the secondary inductors L1-2 and L1-3, are understood to have small values that are conducive to fabrication on a semiconductor die. It would be desirable for the primary inductor L1-1 to have lower loss characteristics, so implementation on the top, thick metal layer is contemplated, while the secondary inductors L1-2 and L1-3, as well as the other inductors within the low noise amplifier circuit 46, may be implemented on lower, thinner metal layers.

Figures 4A, 4B:
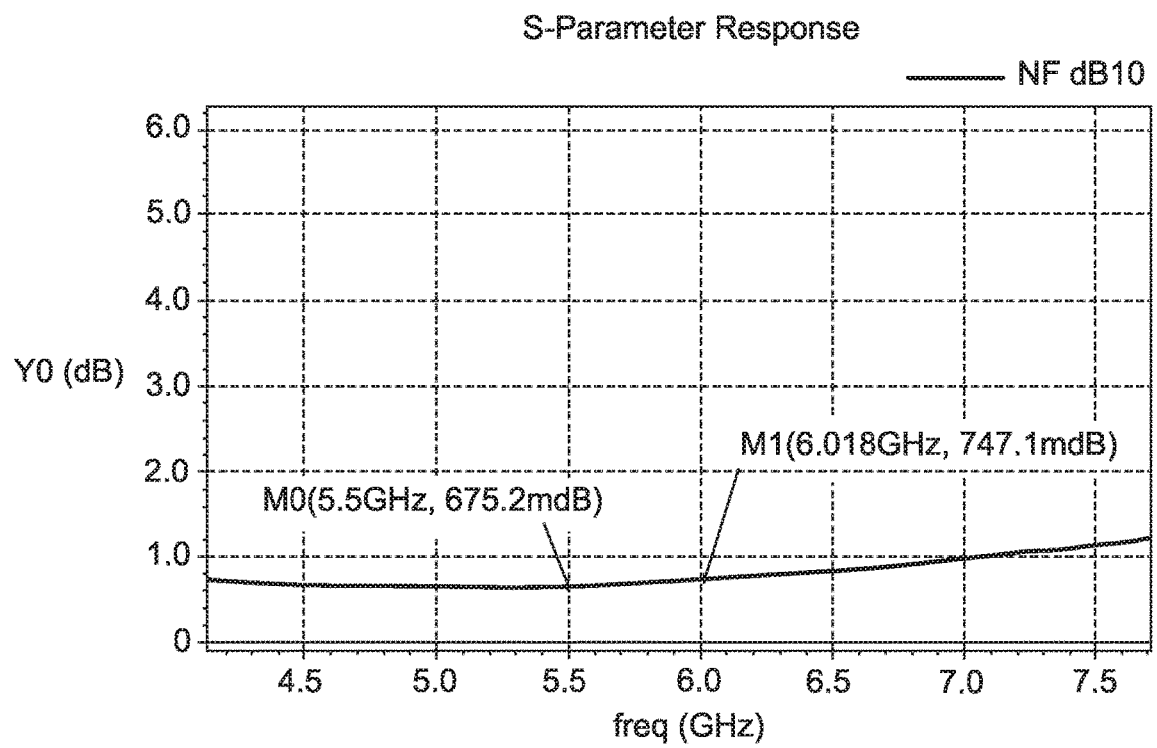
FIGS. 4A-4B are graphs showing the simulated noise figure and gain, respectively, of the embodiment of the low noise amplifier shown in FIG. 3.

The graphs of FIG. 4A-4B plot the simulated performance parameters of the first embodiment of the low noise amplifier circuit 46a. The simulation is based upon the use of an n-channel metal oxide semiconductor (NMOS) transistor that is implemented with a 0.18 um complementary metal oxide semiconductor (CMOS) process. Further, the low noise amplifier transistor M1 is simulated with a 1.8V input/output transistor device in deep n-well. The bias voltage applied to the low noise amplifier circuit 46 is 1.8V, and there is a direct current consumption of approximately 10 mA.

As shown in the graph of FIG. 4A, which shows the overall noise figure of the first embodiment of the low noise amplifier circuit 46a, at the operating frequency of 5.5 GHz in the 5 GHz Industrial, Scientific, and Medical (ISM) band, is approximately 675.2 mdB. The graph of FIG. 4B shows a simulated gain of 12.7 dB at 5.245 GHz. In a comparable circuit with a conventional tank circuit connected to the drain of the low noise amplifier transistor, the gain is reduced to approximately 10 dB for a similar noise figure of 646 mdB. As indicated above, the low noise amplifier circuit 46a of the present disclosure has lower current consumption compared to conventional low noise amplifiers, yet the noise figure is lower for a higher gain.

Figure 5:
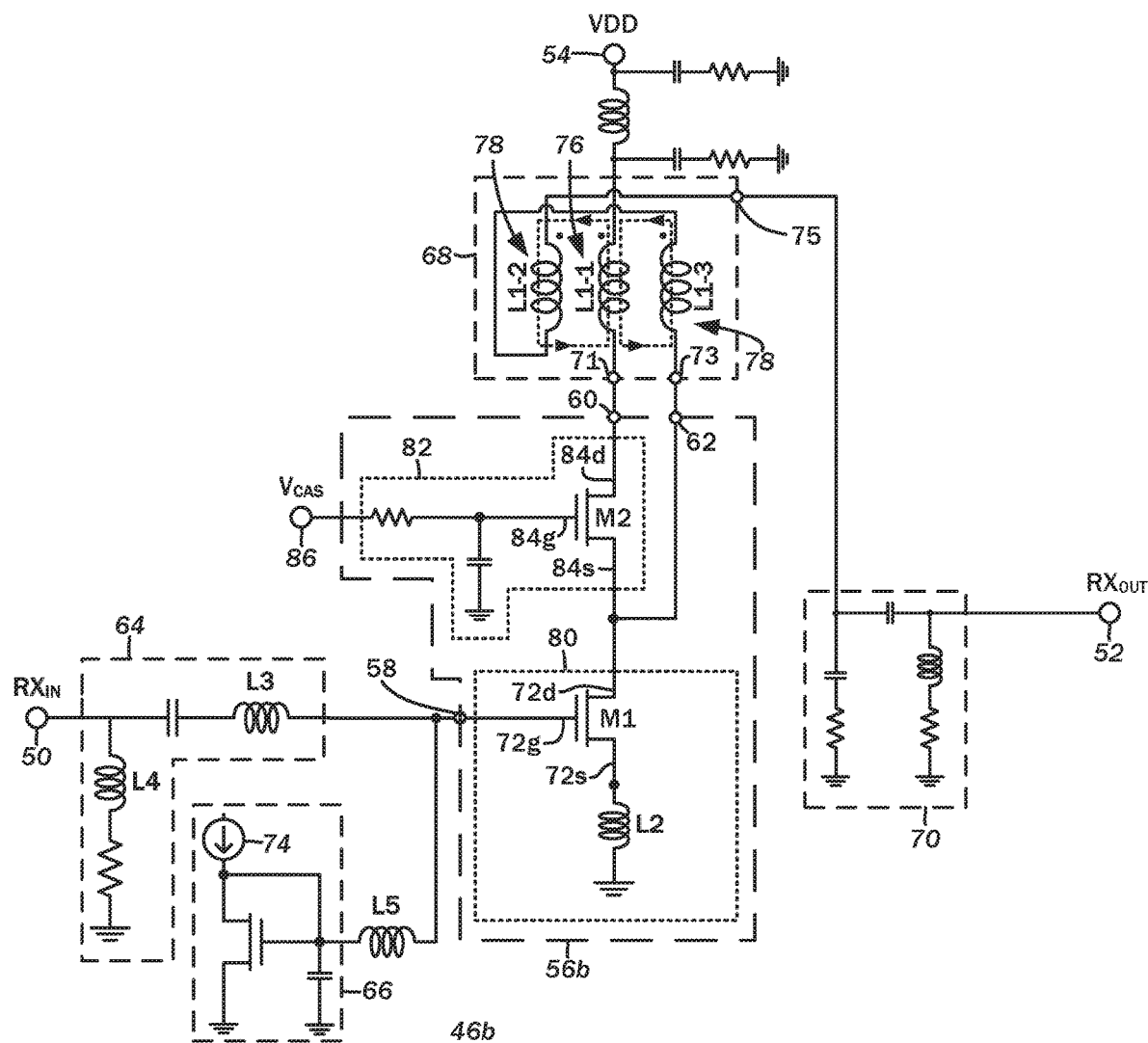
FIG. 5 is a schematic diagram of a second implementation of the low noise amplifier circuit according to the present disclosure.

The schematic diagram of FIG. 5 illustrates a second embodiment of the low noise amplifier circuit 46b, which likewise includes the low noise amplifier 56 with the input 58, the output 60, and the feedback node 62. The input 58 is connected to the receive signal input 50 through the input matching network 64 that impedance and noise matches the input 58 of the low noise amplifier 56 to the switch 42 and the antenna 48 that are connected thereto. The second embodiment 46b also incorporates the current mirror circuit 66 that is connected to the input 58 of the low noise amplifier 56. The output 60 of the low noise amplifier 56 is connected to the coupled inductor circuit 68 via its input 71. Additionally, the coupled inductor circuit 68, via its feedback node 73, is connected to the feedback node 62 of the second embodiment of the low noise amplifier 56b. The output 75 of the coupled inductor circuit 68 is connected to the output matching network 70.

The second embodiment of the low noise amplifier 56b includes the transistor M1 with the gate 72g, the source 72s, and the drain 72d. The transistor M1 is also in a common source configuration, with the source 72s connected to ground/common via the inductor L2. The gate 72g is connected to the input matching network 64. Also connected to the gate 72g is the current mirror circuit 66 comprised of the mirror transistor Mm connected to the current source 74. The current mirror circuit 66 is connected to the gate 72g of the low noise amplifier transistor M1 with an inductor L5.

Besides the transistor M1 and its associated circuit elements generally grouped into a first low noise amplifier section 80, the second embodiment of the low noise amplifier 56b includes a cascode circuit 82. In further detail, the cascode circuit 82 is generally comprised of a cascode transistor M2, which also includes a gate 84g, a drain 84d, and a source 84s. The gate 84g of the cascode transistor M2 is connected a separate control voltage $V_{CAS}$ 86. Additionally, the source 84s of the cascode transistor M2 is connected to the drain 72d of the low noise amplifier transistor M1. As discussed above, the low noise amplifier transistor M1 is an n-channel metal oxide semiconductor type transistor, as is the cascode transistor M2. However, any other suitable transistor type may be readily substituted without departing from the scope of the present disclosure.

Like the first embodiment of the low noise amplifier circuit 46a, the second embodiment of the low noise amplifier 56b is connected to the coupled inductor circuit 68. Again, the coupled inductor circuit 68 includes the primary inductive chain 76 comprised of the primary inductor L1-1, one end of which corresponds to the input 71. The drain 84d of the cascode transistor M2 is instead connected to the primary inductor L1-1. Thus, the output 60 of the second embodiment of the low noise amplifier 56b corresponds to the drain 84d of the cascode transistor M2. The primary inductor L1-1 is also connected to the supply voltage VDD 54.

The coupled inductor circuit 68 also includes the secondary inductive chain 78, which may be comprised of the first secondary inductor L1-2 and the second secondary inductor L1-3. The first secondary inductor L1-2 is connected to the output matching network 70, and so one of the terminals of the first secondary inductor L1-2 corresponds to the output 75 of the coupled inductor circuit 68. As indicated above, the output matching network 70 may have a variety of configurations comprised of inductive, capacitive, and resistive elements.

The first secondary inductor L1-2 is connected in series with the second secondary inductor L1-3, which is then connected to the feedback node 62 of the low noise amplifier 56. In the second embodiment of the low noise amplifier 56b, the feedback node 62 is tied to the junction between the source 84s of the cascode transistor M2 and the drain 72d of the low noise amplifier transistor M1. One node of the second secondary inductor L1-3 is understood to correspond to the feedback node 73 of the coupled inductor circuit 68. The primary inductive chain 76 is magnetically coupled to the secondary inductive chain 78.

Figure 6A:
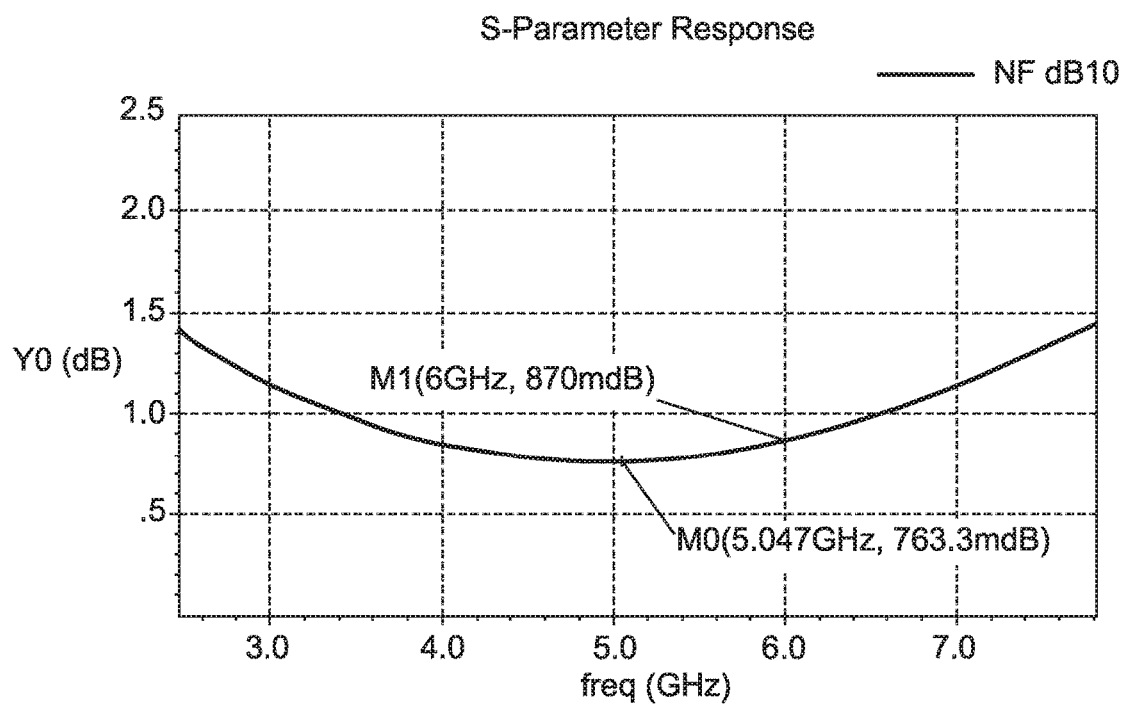
FIGS. 6A-6B are graphs showing the simulated noise figure and gain, respectively, of the embodiment of the low noise amplifier shown in FIG. 5.
Figure 6B:
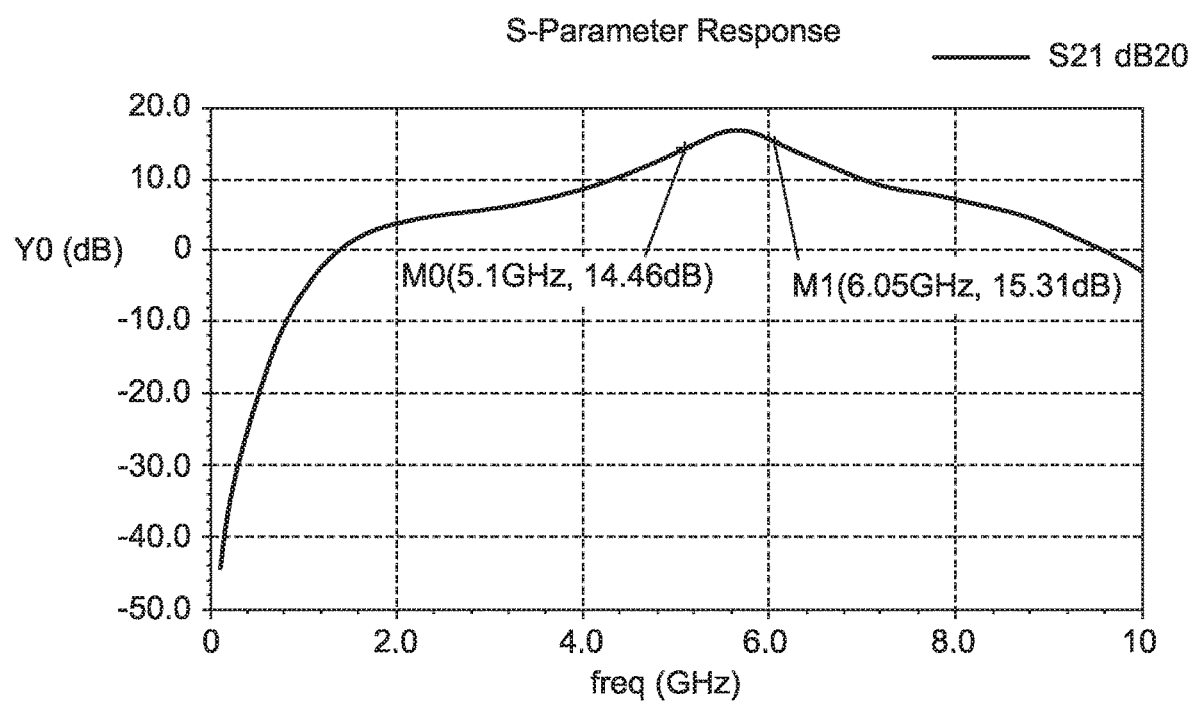

The graphs of FIG. 6A-6B plot the simulated performance parameters of the second embodiment of the low noise amplifier circuit 46b. The simulation is based upon the use of an n-channel metal oxide semiconductor (NMOS) transistor that is implemented with a 0.18 um complementary metal oxide semiconductor (CMOS) process. Further, the low noise amplifier transistor M1 is simulated with a 1.8V input/output transistor device in deep n-well. The bias voltage applied to the low noise amplifier circuit 46 is 3.3V, and there is a direct current consumption of approximately 10 mA.

As shown in the graph of FIG. 6A, which shows the overall noise figure of the second embodiment of the low noise amplifier circuit 46b, at the operating frequency of 5.047 GHz, is approximately 763.3 mdB. The graph of FIG. 6B shows a simulated gain of 14.46 dB at 5.1 GHz. In a comparable circuit with a conventional tank circuit connected to the drain of the cascode transistor, the gain is reduced to approximately 12 dB for a similar noise figure of 843.6 mdB. As indicated above, the low noise amplifier circuit 46b of the present disclosure has lower current consumption compared to conventional low noise amplifiers, yet the noise figure is lower for a higher gain.

Figure 7:
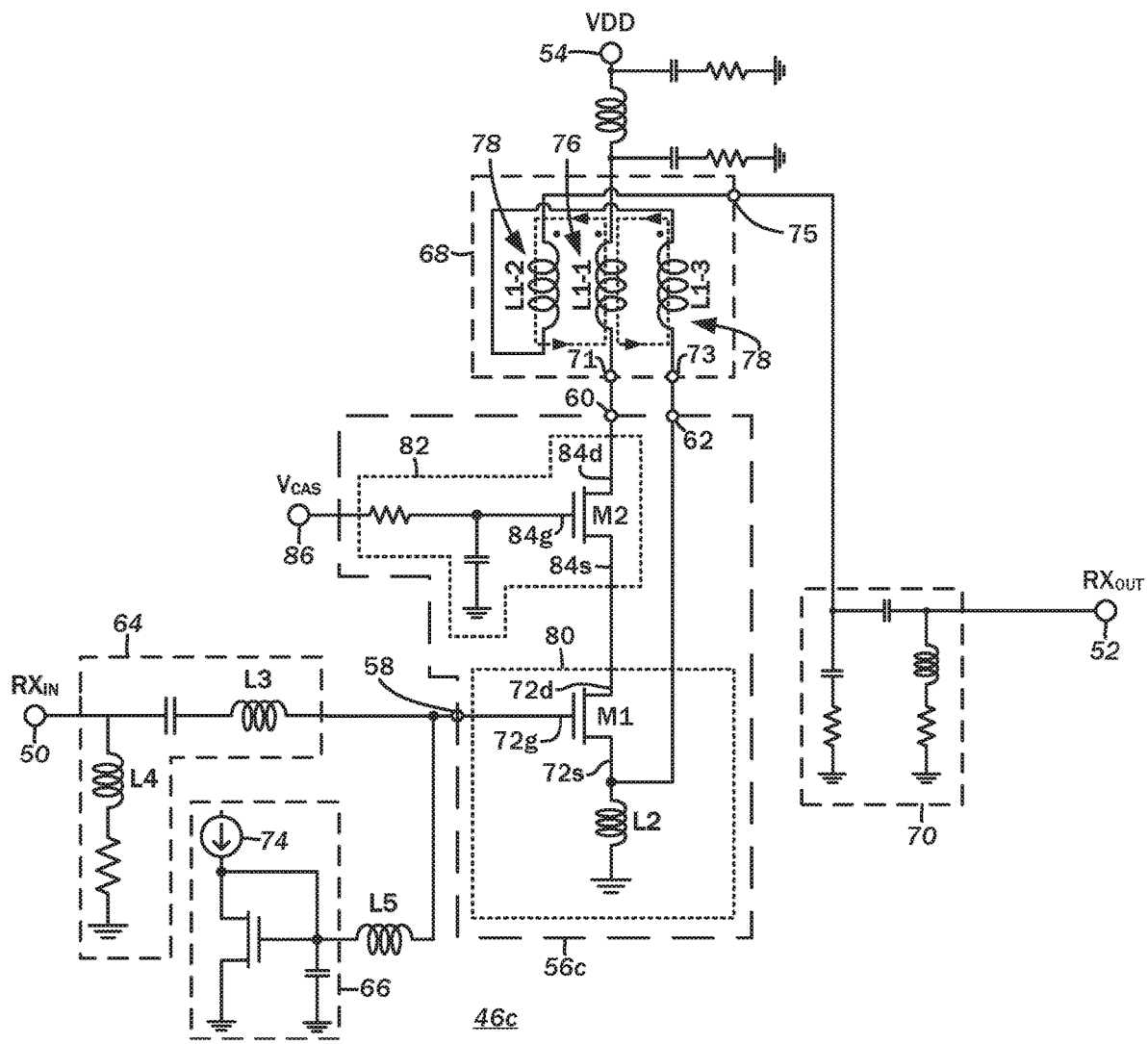
FIG. 7 is a schematic diagram of a third implementation of the low noise amplifier circuit according to the present disclosure.

The schematic diagram of FIG. 7 illustrates a third embodiment of the low noise amplifier circuit 46c, which likewise includes the low noise amplifier 56 with the input 58, the output 60, and the feedback node 62. The input 58 is connected to the receive signal input 50 through the input matching network 64 that impedance and noise matches the input 58 of the low noise amplifier 56 to the switch 42 and the antenna 48 that are connected thereto. The third embodiment 46c also incorporates the current mirror circuit 66 that is connected to the input 58 of the low noise amplifier 56. The output 60 of the low noise amplifier 56 is connected to the coupled inductor circuit 68 via its input 71. Additionally, the coupled inductor circuit 68, via its feedback node 73, is connected to the feedback node 62 of the third embodiment of the low noise amplifier 56c. The output 75 of the coupled inductor circuit 68 is connected to the output matching network 70.

The third embodiment of the low noise amplifier 56c includes the transistor M1 with the gate 72g, the source 72s, and the drain 72d. The transistor M1 is in a common source configuration, with the source 72s connected to ground/common via the inductor L2. The gate 72g is connected to the input matching network 64. Also connected to the gate 72g is the current mirror circuit 66 comprised of the mirror transistor Mm connected to the current source 74. The current mirror circuit 66 is connected to the gate 72g of the low noise amplifier transistor M1 with the inductor L5.

The transistor M1 and its associated circuit elements is generally grouped into the first low noise amplifier section 80, and is part of the low noise amplifier 56b. Additionally, there is the cascode circuit 82 generally comprised of the cascode transistor M2 that includes the gate 84g, the drain 84d, and the source 84s. The gate 84g of the cascode transistor M2 is connected a separate control voltage $V_{CAS}$ 86. Additionally, the source 84s of the cascode transistor M2 is connected to the drain 72d of the low noise amplifier transistor M1. As discussed above, the low noise amplifier transistor M1 is an n-channel metal oxide semiconductor type transistor, as is the cascode transistor M2. Again, any other suitable transistor type may be readily substituted without departing from the scope of the present disclosure.

Like in the first embodiment and the second embodiment of the low noise amplifier circuit 46a, 46b the third embodiment of the low noise amplifier 56c is connected to the coupled inductor circuit 68. Again, the coupled inductor circuit 68 includes the primary inductive chain 76 comprised of the primary inductor L1-1, one end of which corresponds to the input 71. The drain 84d of the cascode transistor M2 is instead connected to the primary inductor L1-1. Thus, the output 60 of the second embodiment of the low noise amplifier 56b corresponds to the drain 84d of the cascode transistor M2. The primary inductor L1-1 is also connected to the supply voltage VDD 54.

The coupled inductor circuit 68 includes the secondary inductive chain 78, which may be comprised of the first secondary inductor L1-2 and the second secondary inductor L1-3. The first secondary inductor L1-2 is connected to the output matching network 70, and so one of the terminals of the first secondary inductor L1-2 corresponds to the output 75 of the coupled inductor circuit 68. As indicated above, the output matching network 70 may have a variety of configurations comprised of inductive, capacitive, and resistive elements.

The first secondary inductor L1-2 is connected in series with the second secondary inductor L1-3, which is then connected to the feedback node 62 of the low noise amplifier 56. In the third embodiment of the low noise amplifier 56b, the feedback node 62 is tied to the source 72s of the low noise amplifier transistor M1. One node of the second secondary inductor L1-3 is understood to correspond to the feedback node 73 of the coupled inductor circuit 68. The primary inductive chain 76 is magnetically coupled to the secondary inductive chain 78, as discussed in detail above.

Figure 8A:
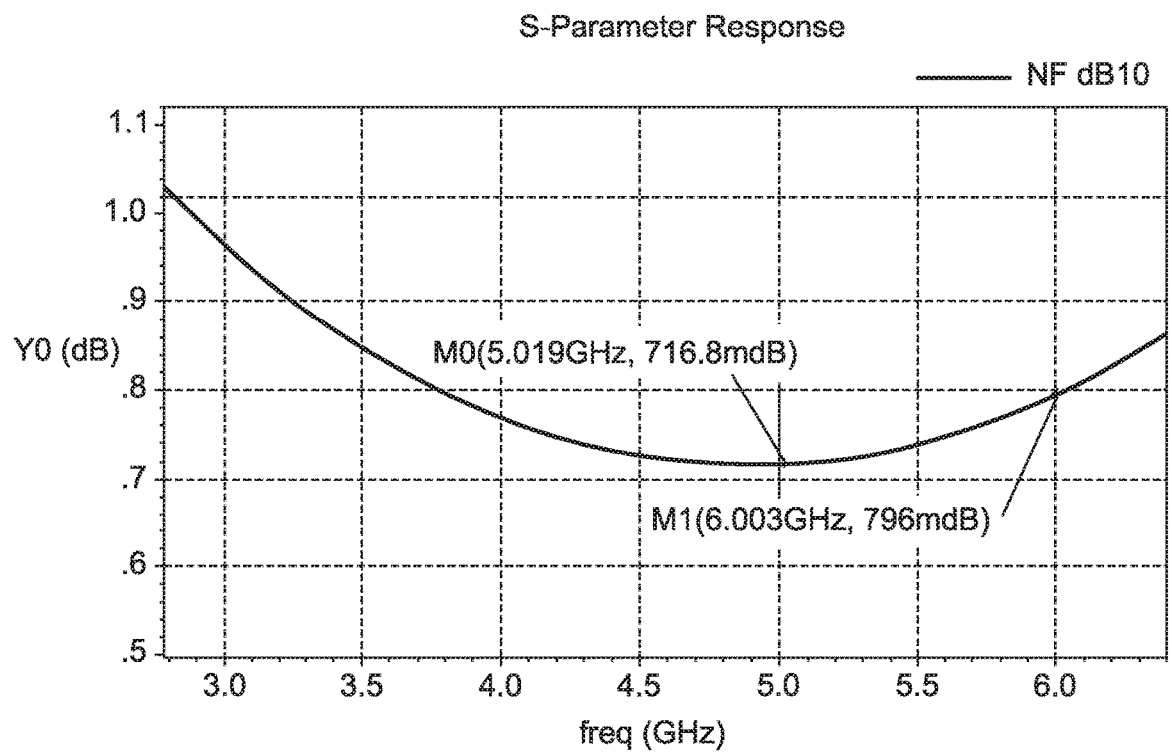
FIG. 8A-8B are graphs showing the simulated noise figure and gain, respectively, of the embodiment of the low noise amplifier shown in FIG. 7.
Figure 8B:
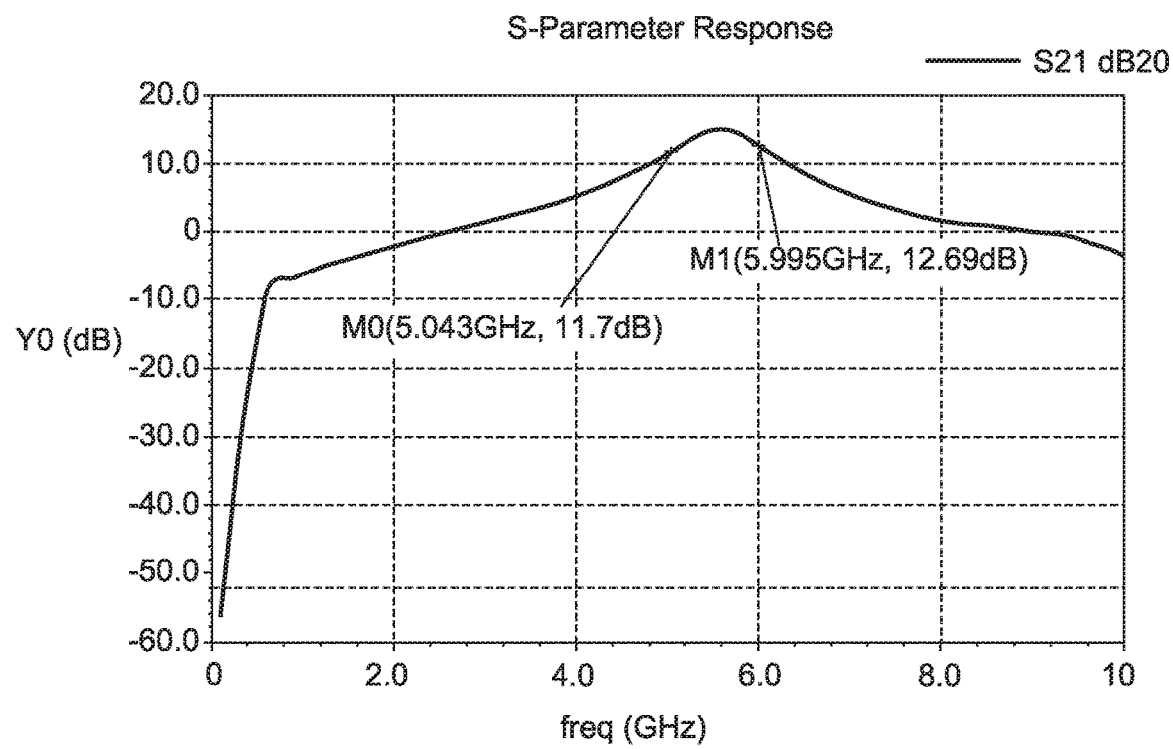
Figure 9:
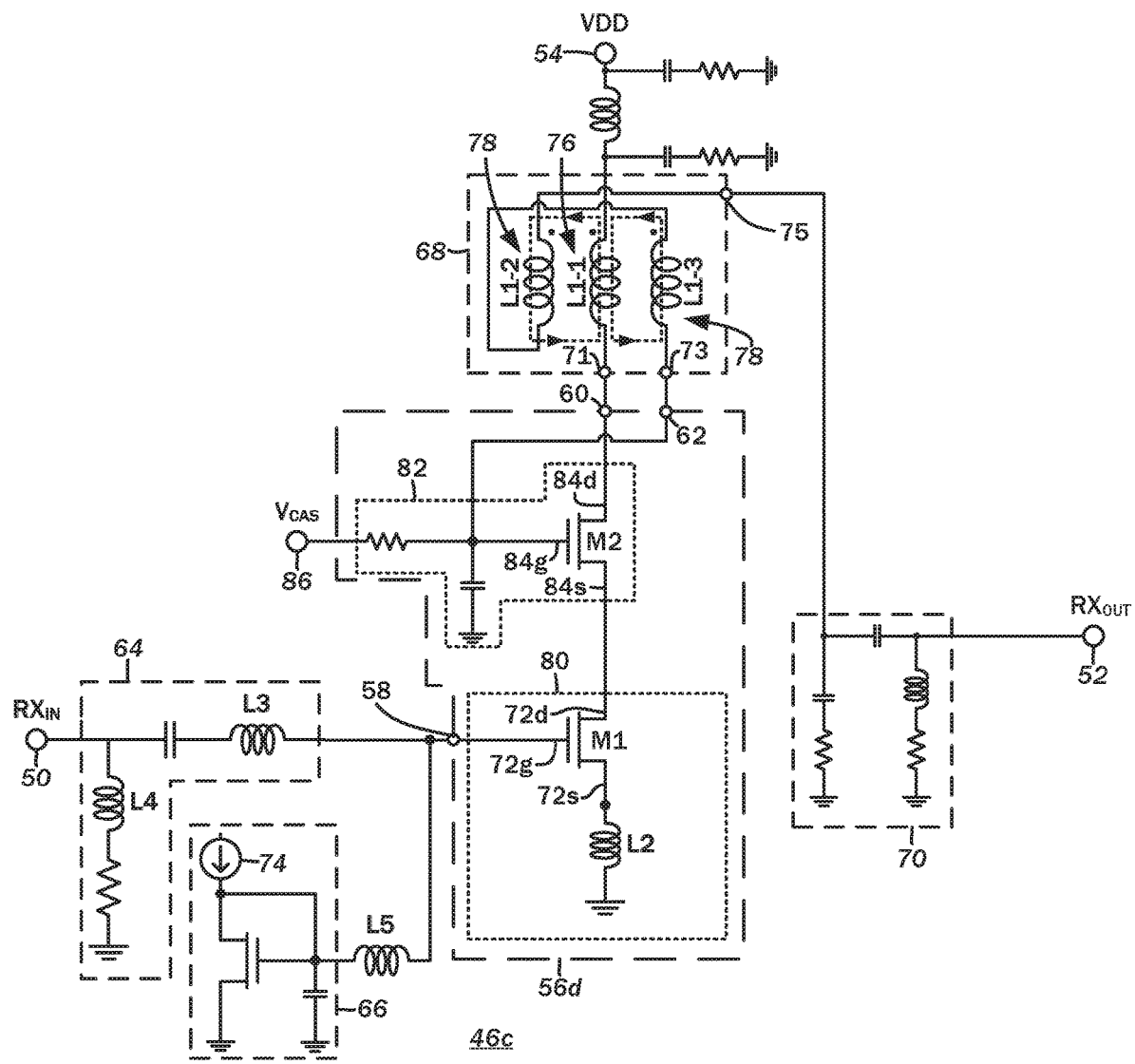
FIG. 9 is a schematic diagram of a fourth implementation of the low noise amplifier circuit according to the present disclosure.

The graphs of FIG. 8A-8B plot the simulated performance parameters of the third embodiment of the low noise amplifier circuit 46b. The simulation is based upon the use of an n-channel metal oxide semiconductor (NMOS) transistor that is implemented with a 0.18 um complementary metal oxide semiconductor (CMOS) process. Further, the low noise amplifier transistor M1 is simulated with a 1.8V input/output transistor device in deep n-well. The bias voltage applied to the low noise amplifier circuit 46 is 3.3V, and there is a direct current consumption of approximately 10 mA.

As shown in the graph of FIG. 8A, which shows the overall noise figure of the third embodiment of the low noise amplifier circuit 46c, at the operating frequency of 5.019 GHz, is approximately 716.8 mdB. The graph of FIG. 8B shows a simulated gain of 11.7 dB at 5.043 GHz. The third embodiment of the low noise amplifier circuit 46c is likewise envisioned to exhibit lower current consumption compared to conventional low noise amplifiers, but with the noise figure being lower for a higher gain. The contemplated third embodiment of the low noise amplifier circuit 46c is understood to be suitable for applications with higher bias voltages, e.g., 3.3V, on a system-level.

FIG. 7 is a schematic diagram of a fourth embodiment of the low noise amplifier circuit 46d, which also includes the low noise amplifier 56 with the input 58, the output 60, and the feedback node 62. The input 58 is connected to the receive signal input 50 through the input matching network 64 that impedance and noise matches the input 58 of the low noise amplifier 56 to the switch 42 and the antenna 48 that are connected thereto. The fourth embodiment 46d also incorporates the current mirror circuit 66 that is connected to the input 58 of the low noise amplifier 56. The output 60 of the low noise amplifier 56 is connected to the coupled inductor circuit 68 via its input 71. Additionally, the coupled inductor circuit 68, via its feedback node 73, is connected to the feedback node 62 of the fourth embodiment of the low noise amplifier 56d. The output 75 of the coupled inductor circuit 68 is connected to the output matching network 70.

The fourth embodiment of the low noise amplifier 56d includes the transistor M1 with the gate 72g, the source 72s, and the drain 72d. The transistor M1 is in a common source configuration, with the source 72s connected to ground/common via the inductor L2. The gate 72g is connected to the input matching network 64. Also connected to the gate 72g is the current mirror circuit 66 comprised of the mirror transistor Mm connected to the current source 74. The current mirror circuit 66 is connected to the gate 72g of the low noise amplifier transistor M1 with the inductor L5.

The transistor M1 and its associated circuit elements is generally grouped into the first low noise amplifier section 80, and is part of the low noise amplifier 56d. Additionally, there is the cascode circuit 82 generally comprised of the cascode transistor M2 that includes the gate 84g, the drain 84d, and the source 84s. The gate 84g of the cascode transistor M2 is connected a separate control voltage $V_{CAS}$ 86. Additionally, the source 84s of the cascode transistor M2 is connected to the drain 72d of the low noise amplifier transistor M1. The low noise amplifier transistor M1 is an n-channel metal oxide semiconductor type transistor, as is the cascode transistor M2, though any other suitable transistor type may be readily substituted without departing from the scope of the present disclosure.

Like in the first embodiment, second embodiment, and the third embodiment of the low noise amplifier circuit 46a, 46b, 46c, the fourth embodiment of the low noise amplifier 56d is connected to the coupled inductor circuit 68. Again, the coupled inductor circuit 68 includes the primary inductive chain 76 comprised of the primary inductor L1-1, one end of which corresponds to the input 71. The drain 84d of the cascode transistor M2 is instead connected to the primary inductor L1-1. Thus, the output 60 of the second embodiment of the low noise amplifier 56b corresponds to the drain 84d of the cascode transistor M2. The primary inductor L1-1 is also connected to the supply voltage VDD 54.

The coupled inductor circuit 68 includes the secondary inductive chain 78, which may be comprised of the first secondary inductor L1-2 and the second secondary inductor L1-3. The first secondary inductor L1-2 is connected to the output matching network 70, and so one of the terminals of the first secondary inductor L1-2 corresponds to the output 75 of the coupled inductor circuit 68. As indicated above, the output matching network 70 may have a variety of configurations comprised of inductive, capacitive, and resistive elements.

The first secondary inductor L1-2 is connected in series with the second secondary inductor L1-3, which is then connected to the feedback node 62 of the low noise amplifier 56. In the fourth embodiment of the low noise amplifier 56d, the feedback node 62 is tied to the gate 84g of the cascode transistor M2. One node of the second secondary inductor L1-3 is understood to correspond to the feedback node 73 of the coupled inductor circuit 68. The primary inductive chain 76 is magnetically coupled to the secondary inductive chain 78, as discussed above.

Figure 10A:
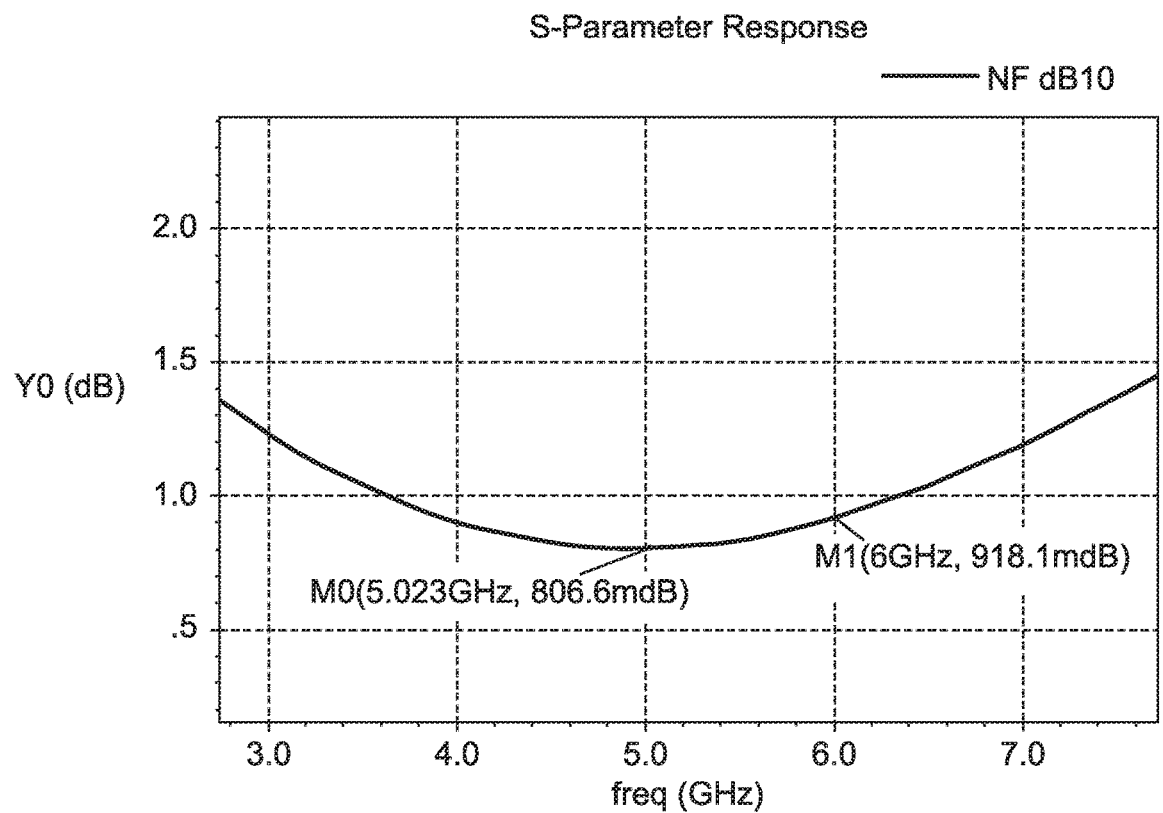
FIGS. 10A-10B are graphs showing the simulated noise figure and gain, respectively, of the embodiment of the low noise amplifier shown in FIG. 9.
Figure 10B:
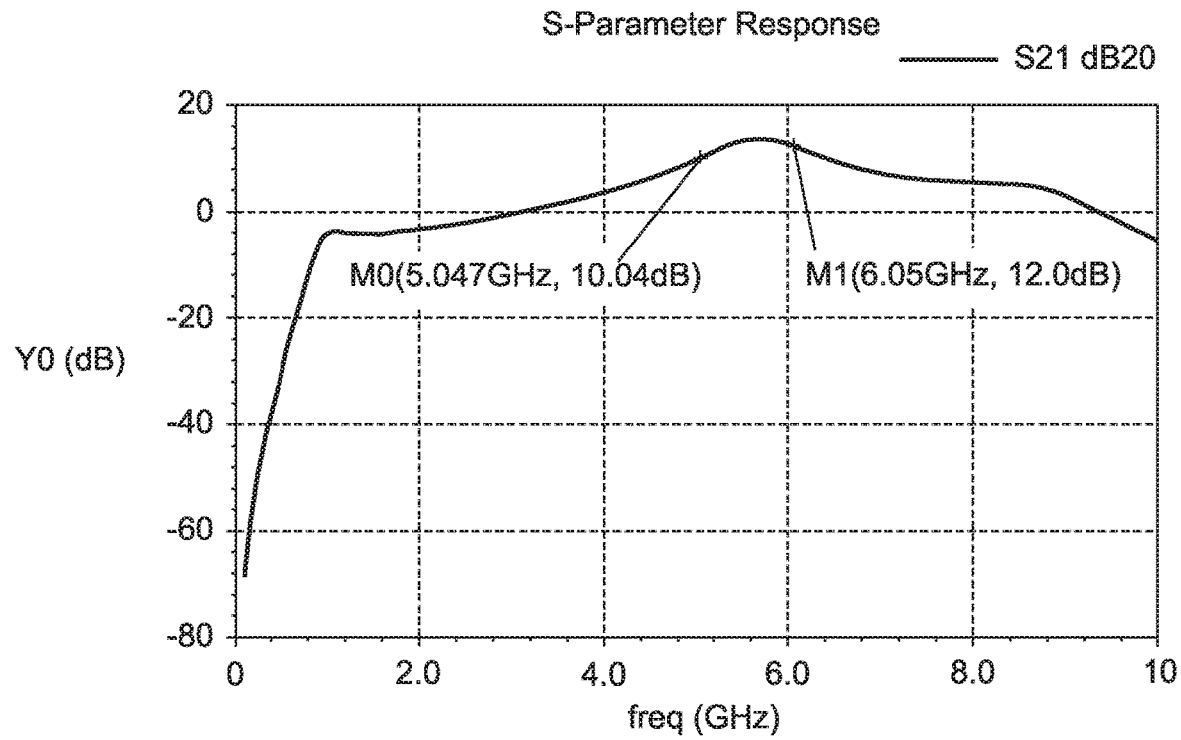

The graphs of FIG. 10A-10B plot the simulated performance parameters of the fourth embodiment of the low noise amplifier circuit 46c. The simulation is based upon the use of an n-channel metal oxide semiconductor (NMOS) transistor that is implemented with a 0.18 um complementary metal oxide semiconductor (CMOS) process. The low noise amplifier transistor M1 is simulated with a 1.8V input/output transistor device in deep n-well. The bias voltage applied to the low noise amplifier circuit 46 is 3.3V, and there is a direct current consumption of approximately 10 mA.

As shown in the graph of FIG. 10A, which shows the overall noise figure of the fourth embodiment of the low noise amplifier circuit 46d, at the operating frequency of 5.023 GHz, is approximately 806.6 mdB. The graph of FIG. 10B shows a simulated gain of 10.04 dB at 5.047 GHz. The fourth embodiment of the low noise amplifier circuit 46d is envisioned to exhibit lower current consumption compared to conventional low noise amplifiers, but with the noise figure being lower for a higher gain. The contemplated fourth embodiment of the low noise amplifier circuit 46d is understood to be suitable for applications with higher bias voltages, e.g., 3.3V, and where direct current decoupling is needed on a system-level.

Although the foregoing description considered the various embodiments of the low noise amplifier circuit 46, it will be appreciated that the features thereof are applicable to other amplifier circuit where low noise, low current consumption, and high gain are desirable. That is, the various features may be implemented in power amplifier circuits as well. The modifications needed for such alternative applications, given the present disclosure, is also deemed to be within the purview of those having ordinary skill in the art.

Figure 11:
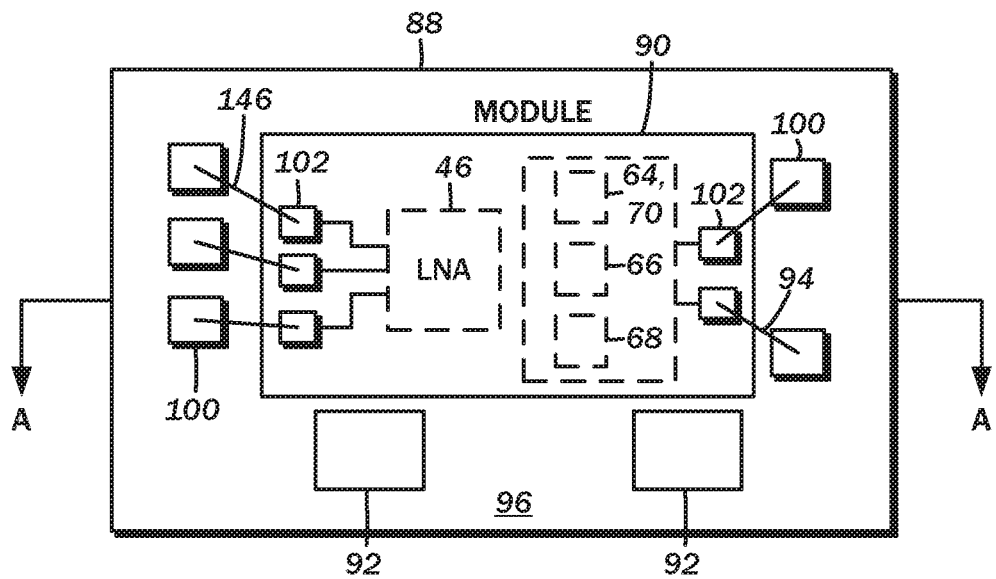
FIG. 11 is a schematic diagram of a packaged amplifier module.
Figure 12:
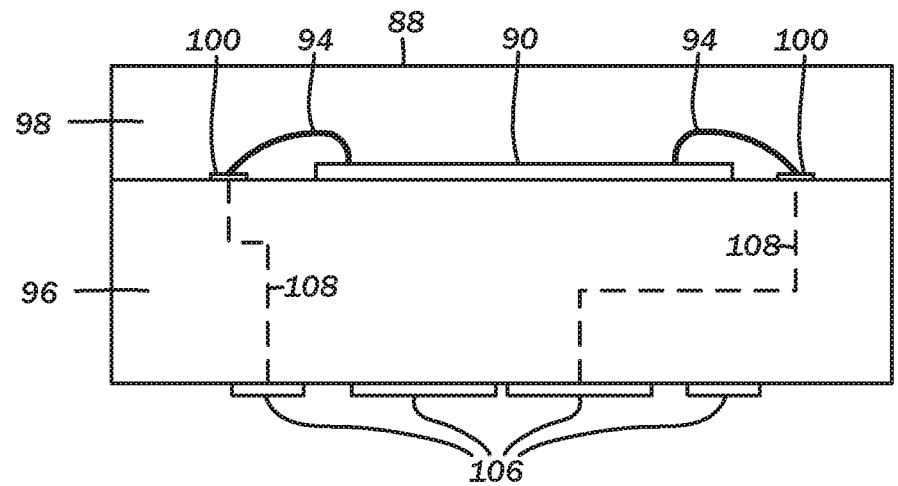
FIG. 12 is a schematic diagram of a cross-section of the packaged amplifier module shown in FIG. 10.

FIG. 11 is a schematic diagram of an embodiment of a packaged radio frequency communications module 88, while FIG. 12 is a schematic diagram of a cross-section of the packaged radio frequency communications module 88 taken along axis A-A of FIG. 11. The packaged radio frequency communications module 88 includes an integrated circuit or die 90, surface mount components 92, wire bonds 94, a package substrate 96, and an encapsulation structure 98. The package substrate 96 includes pads 100 formed from conductors disposed therein. Additionally, the die 90 includes pads 102, and the wire bonds 94 are used to electrically connect the pads 102 of the die 90 to the pads 104 of the package substrate 96.

The die 90 includes the low noise amplifier circuit 46 formed therein. Specifically, the die 90 includes the low noise amplifier 56, the coupled inductor circuit 68, the current mirror circuit 66, as well as the input matching network 64 and the output matching network 70. The foregoing components on the die 90 are understood to be as described above.

The die 90 is mounted to the package substrate 96 as shown, though it may be configured to receive a plurality of additional components such as the surface mount components 92. These components include additional integrated circuits as well as passive components such as capacitors, inductors, and resistors.

As shown in FIG. 12, the packaged radio frequency communications module 88 is shown to include a plurality of contact pads 106 disposed on the side of the packaged radio frequency communications module 88 opposite the side used to mount the die 90. Configuring the packaged radio frequency communications module 88 in this manner can aid in connecting the same to a circuit board of the wireless communications device 10. The example contact pads 106 can be configured to provide radio frequency signals, bias signals, power low voltage(s) and or power high voltage(s) to the die 90 and/or the surface mount components 92. The electrical connections between the contact pads 106 and the die 90 can be facilitated by connections 108 through the package substrate 96. The connections 108 can represent electrical paths formed through the package substrate 96, such as connections associated with vias and conductors of a multilayer laminated package substrate.

In some embodiments, the packaged radio frequency communications module 88 can also include or more packaging structures to, for example, provide protection and/or to facilitate handling of the packaged radio frequency communications module 88. Such a packaging structure can include overmold or encapsulation structure 98 formed over the package substrate 96 and the components and die(s) disposed thereon.

It will be understood that although the packaged radio frequency communications module 88 is described in the context of electrical connections based on wire bonds, one or more features of the present disclosure can also be implemented in other packaging configurations, including, for example, flip-chip configurations.

The particulars shown herein are by way of example and for purposes of illustrative discussion of the embodiments of the low noise amplifier circuit only and are presented in the cause of providing what is believed to be the most useful and readily understood description of the principles and conceptual aspects. In this regard, no attempt is made to show details with more particularity than is necessary, the description taken with the drawings making apparent to those skilled in the art how the several forms of the present disclosure may be embodied in practice.

What is claimed is:

1. A radio frequency amplifier circuit comprising:
an amplifier with an input, an output, and a feedback node; and
a coupled inductor circuit including:
a primary inductor electrically connected to the output of the amplifier; and
one or more interconnected secondary inductors, at least one of which is electrically connected to the feedback node of the amplifier and at least one of which is electrically connected to an output of the radio frequency amplifier circuit, the primary inductor and each of the one or more secondary inductors being separately electromagnetically coupled to the primary inductor, with a transformation factor of a signal current to an output of the coupled inductor circuit being increased by the coupled inductor circuit.

2. The radio frequency amplifier circuit of claim 1 wherein the amplifier is a low noise amplifier.

3. The radio frequency amplifier circuit of claim 1 further comprising an output matching network connected to the coupled inductor circuit.

4. The radio frequency amplifier circuit of claim 1 wherein the one or more interconnected secondary inductors are connected in series.

5. The radio frequency amplifier circuit of claim 1 further comprising a current mirror circuit connected to the input of the amplifier.

6. The radio frequency amplifier circuit of claim 1 wherein the amplifier includes an amplifier transistor with a gate, a source, and a drain.

7. The radio frequency amplifier circuit of claim 6 wherein the feedback node of the amplifier is the source of the amplifier transistor, the coupled inductor circuit being connected thereto.

8. The radio frequency amplifier circuit of claim 6 wherein the amplifier includes a cascode transistor connected to the amplifier transistor and to the coupled inductor circuit.

9. The radio frequency amplifier circuit of claim 8 wherein the cascode transistor is connected to an independent control voltage.

10. The radio frequency amplifier circuit of claim 8 wherein the cascode transistor includes a gate, a source, and a drain, the source of the cascode transistor being connected to the drain of the amplifier transistor.

11. The radio frequency amplifier circuit of claim 10 wherein the feedback node of the amplifier is the source of the cascode transistor and the drain of the amplifier transistor, the coupled inductor circuit being connected thereto.

12. The radio frequency amplifier circuit of claim 10 wherein the feedback node of the amplifier is the source of the amplifier transistor, the coupled inductor circuit being connected thereto.

13. The radio frequency amplifier circuit of claim 10 wherein the feedback node of the amplifier is the gate of the cascode transistor, the coupled inductor circuit being connected thereto.

14. The radio frequency amplifier circuit of claim 1 further comprising an input matching circuit connected to the input of the amplifier.

15. An amplifier circuit with a receive signal input and a receive signal output, the amplifier circuit comprising:
an amplifier with an input, an output, and a feedback node, the input of the amplifier being connected to the receive signal input of the amplifier circuit;
a primary inductive chain connected to the output of the amplifier; and
a secondary inductive chain connected to the feedback node of the amplifier and to the receive signal output of the amplifier circuit, the secondary inductive chain being electromagnetically coupled to the primary inductive chain.

16. The amplifier circuit of claim 15 wherein the amplifier is a low noise amplifier.

17. The amplifier circuit of claim 15 further comprising an output matching network connected to the secondary inductive chain and to the receive signal output of the amplifier circuit.

18. The amplifier circuit of claim 15 wherein the amplifier includes an amplifier transistor with a gate, a source, and a drain, the gate being connected to the receive signal input of the amplifier circuit.

19. The amplifier circuit of claim 18 wherein the drain of the amplifier transistor is the output of the amplifier and is connected to the primary inductive chain.

20. The amplifier circuit of claim 18 wherein the source of the amplifier transistor is the feedback node of the amplifier and is connected to the secondary inductive chain.

21. The amplifier circuit of claim 18 wherein the amplifier includes a cascode transistor with a gate, a source, and a drain, the source of the cascode transistor being connected to the drain of the amplifier transistor at a first junction.

22. The amplifier circuit of claim 21 wherein the drain of the cascode transistor is the output of the amplifier and is connected to the primary inductive chain.

23. The amplifier circuit of claim 21 wherein the first junction is the feedback node of the amplifier and is connected to the secondary inductive chain.

24. The amplifier circuit of claim 21 wherein the gate of the cascode transistor is connected to an independent control voltage.

25. The amplifier circuit of claim 21 wherein the source of the amplifier transistor is the feedback node of the amplifier and is connected to the secondary inductive chain.

26. The amplifier circuit of claim 21 wherein the gate of the cascode transistor is the feedback node of the amplifier and is connected to the secondary inductive chain.

27. A communications module comprising:
a semiconductor substrate on which a plurality of components are fabricated, the semiconductor substrate including a plurality of metal layers including a top metal layer and one or more lower metal layers, the top metal layer having a greater thickness than the lower metal layers; and
an amplifier circuit implemented on the semiconductor substrate, the amplifier circuit including an amplifier with an input, an output, and a feedback node and a coupled inductor circuit, the coupled inductor circuit including:
a primary inductor electrically connected to the output of the amplifier; and
one or more interconnected secondary inductors, at least one of which is electrically connected to the feedback node of the amplifier and at least one of which is electrically connected to an output of the amplifier circuit, the primary inductor and each of the one or more secondary inductors being separately electromagnetically coupled to the primary inductor.

28. The communications module of claim 27 wherein the amplifier is a low noise amplifier.

29. The communications module of claim 27 wherein the primary inductor is fabricated on the top metal layer.

30. The communications module of claim 27 wherein the one or more interconnected secondary inductors are fabricated on the one or more lower metal layers.

\* \* \* \* \*